United States Patent [19]

Yabe

[11] Patent Number: 5,726,074
[45] Date of Patent: Mar. 10, 1998

[54] METHOD AND APPARATUS FOR MANUFACTURING SEMICONDUCTOR DEVICE

[75] Inventor: Manabu Yabe, Tokyo, Japan

[73] Assignee: NEC Corporation, Tokyo, Japan

[21] Appl. No.: 569,842

[22] Filed: Dec. 8, 1995

[30] Foreign Application Priority Data

Dec. 8, 1994 [JP] Japan ................................. 6-331112

[51] Int. Cl.$^6$ .................................................. H01L 21/00
[52] U.S. Cl. .......................................................... 438/10
[58] Field of Search ............................... 437/7–8; 438/10

[56] References Cited

U.S. PATENT DOCUMENTS

| | | | |
|---|---|---|---|
| 5,219,765 | 6/1993 | Yoshida et al. | 437/8 |
| 5,240,866 | 8/1993 | Friedman et al. | 437/8 |
| 5,256,578 | 10/1993 | Corley et al. | 437/8 |
| 5,350,715 | 9/1994 | Lee | 437/250 |

FOREIGN PATENT DOCUMENTS 1-194331  8/1989  Japan .

*Primary Examiner*—Jey Tsai
*Assistant Examiner*—Richard A. Booth
*Attorney, Agent, or Firm*—Sughrue, Mion, Zinn, Macpeak & Seas, PLLC

[57] ABSTRACT

In a method and an apparatus for manufacturing a semiconductor integrated circuit, including a wafer test process, an assembling process and a sorting process, electric characteristics of a plurality of semiconductor integrated circuits formed on a wafer, is measured, and then stored in a memory means together with data of the position of each semiconductor integrated circuit. The plurality of semiconductor integrated circuits on the wafer are cut into individual semiconductor integrated circuit chips. On the basis of the position data and the electric characteristics of each of the semiconductor integrated circuit chips read from the memory means, the semiconductor integrated circuit chips are classified into at least two subsets each consisting of non-defective semiconductor integrated circuit chips having the same electric characteristics different from that of products included in the other subset, and the non-defective semiconductor integrated circuit chips included in each of the at least two subsets, are packaged for each of the at least two subsets, so that the sorting is simultaneously carried out.

3 Claims, 12 Drawing Sheets

GRADE DISCRIMINATION
WHEN PRODUCTS INCLUDE
ONLY A-GRADE

GRADE DISCRIMINATION
WHEN PRODUCTS INCLUDE
ONLY B-GRADE

GRADE DISCRIMINATION
WHEN PRODUCTS INCLUDE
ONLY C-GRADE

GRADE DISCRIMINATION WHEN PRODUCTS
INCLUDE A-GRADE AND B-GRADE

GRADE DISCRIMINATION WHEN PRODUCTS
INCLUDE B-GRADE AND C-GRADE

GRADE DISCRIMINATION WHEN
PRODUCTS INCLUDE A-GRADE,
B-GRADE AND C-GRADE

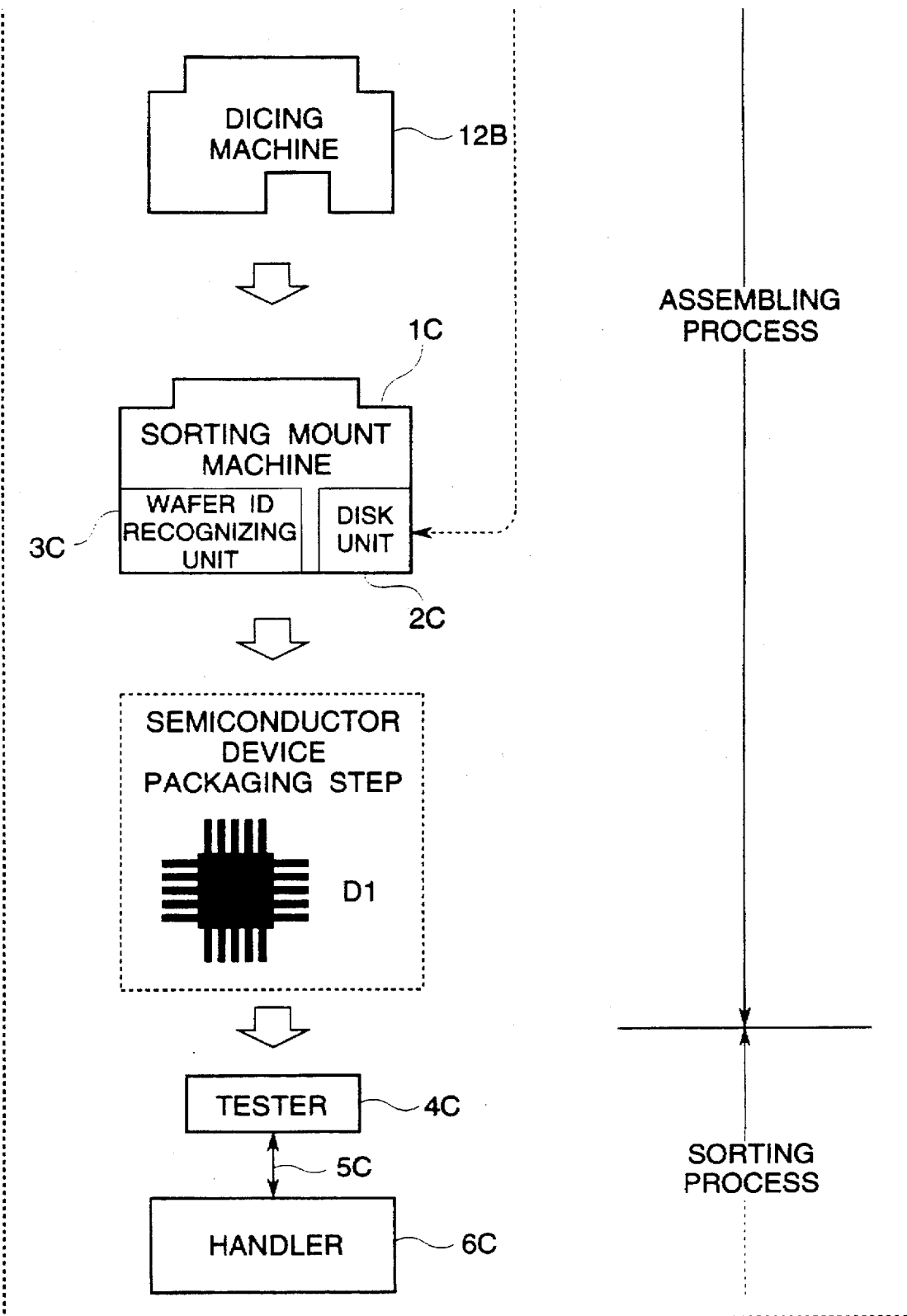

METHOD AND APPARATUS FOR MANUFACTURING SEMICONDUCTOR DEVICE

BACKGROUND OF THE INVENTION

1. Field of the Invention

The present invention relates to a method and an apparatus for manufacturing semiconductor devices, and more specifically, wafer testing, assembling and sorting steps in the process of manufacturing semiconductor integrated circuits.

2. Description of Related Art

Referring to FIGS. 1A to 1E and 2, a conventional technique is shown for measuring semiconductor integrated circuits on a semiconductor wafer, and performing of packaging and sorting of those integrated circuits.

In this specification, each of the semiconductor integrated circuits on a semiconductor wafer will be called a "semiconductor chip", and the semiconductor integrated circuit assembled into a package will be called a "semiconductor device".

Now, the conventional technique will be described with reference to FIGS. 1A to 1E and 2. FIGS. 1A to 1E illustrate wafer conditions in various steps in the conventional process, and FIG. 2 illustrates various machines, in the form of blocks, for performing the various steps onto the semiconductor wafer.

First, in a wafer test process, each of semiconductor chips 1E formed on a semiconductor wafer W5 shown in FIG. 1A is measured.

This measurement is carried out by using a tester 4F connected through a GP-IB cable 3F to a prober 2F comprising a disk unit 1F, as shown in FIG. 2. On the basis of the result of the measurement, only positional coordinates data of non-defectives and defectives is written into a disk 5F in the disk unit 1F.

In the same wafer test process, the disk 5F thus written is moved to a marking machine (single purpose machine) 7F having a disk unit 6F, so that the positional coordinates data of non-defectives and defectives is read out from the disk 5F. The wafer W5 is also moved to the marking machine 7F. On the basis of the positional coordinates data of non-defectives and defectives read out from the disk 5F, a marking operation is carried out to the wafer W5 as shown in FIG. 1B, so that as shown in FIG. 1C, a marking M1 is given to only defective semiconductor chips on the wafer 6B.

Thus, the wafer test process is completed, and then, an assembling process is performed. The wafer W6 given with the necessary marking M1 is set on a wafer mount machine 8F, so that the wafer W6 is adhered to a wafer adhering sheet 3E on a wafer ring 2E.

Next, the wafer is moved to a dicing machine 9F, in which the wafer W6 is cut along a scribing line 4E so that the wafer is separated into individual semiconductor chips.

Then, the wafer ring 2E bearing thereon the adhered wafer W6 cut as shown in FIG. 1E is set into a mount machine 10F as shown in FIG. 2. The mount machine 10F shown in FIG. 2 is so configured that a surface image of the wafer W7 is taken by a camera 11F which can recognize a black-and-white image, and the obtained surface image of the wafer W7 is converted into a binary image data by an image recognizing unit 13F connected through a cable 12F to the camera 11F. Only the semiconductor chips which are given with no marking, are discriminated as non-defective, and mounted on a lead frame (not shown).

Generally, in a semiconductor device market, particularly, in a memory product market, the commercial demand and the price are different dependently upon grades classified on the basis of the electric characteristics of the semiconductor device. For example, in the case of 4MDRAM, the products of the operation speed of 60 nsec are bought and sold at a price higher than that of the products of the operation speed 80 nsec, and in great demand. As regards the operation speed, it is an ordinary practice to classify the products by the operation speed of not higher than 60 nsec, the operation speed in the range from 60 nsec to 80 nsec, and the operation speed of not less than 80 nsec. Here, in a semiconductor device manufacturing process including diffusion processes, it is impossible to control the operation speed to only a single grade, at a level of the outlet of the manufacturing equipment, and therefore, after all of chips are assembled, the products are sorted. As a result, the semiconductor device having the operation speed of not less than 80 nsec, which is in less demand, are inevitably assembled. This elevates the manufacturing cost and the stocking cost.

In order to overcome the above mentioned problem, for example, Japanese Patent Application Laid-open Publication JP-A-1-194331 proposes an improved semiconductor device manufacturing process based on the above mentioned technique. According to this proposed process, as one example of a method dependent on electric characteristics, an operating speed of a DRAM memory is classified into different grades, and a marking is performed in accordance with the discriminated grades by using a different color ink corresponding to each of the grades.

More specifically, the process proposed by JP-A-1-194331 is different from the above mentioned technique in the following points: First, of the data obtained in the wafer test process, the operation speed of respective non-defective semiconductor chips formed on the wafer W5 shown in FIG. 1A and the corresponding positional coordinates data are written into the disk 5F shown in FIG. 2. In the marking machine 7F, the data is read out from the disk 5F, and a surface of the non-defective semiconductor chip is marked by using a different color corresponding to the operation speed of the non-defective semiconductor chip to be marked. In the mount machine 10F, a color image pick-up camera is used to recognize a color of the marking and to select the chips of the same operation speed, so that each chip is die-bonded on the lead frame in units of the same operation speed. In other words, the assembling and sorting are carried out in each unit of the same grade.

However, at present, the items to be checked at a level of the outlet of the manufacturing equipment, includes not only the operation speed but also hold characteristics, which is classified into two grades, a 4k refresh product and a 2k refresh product.

Accordingly, if the products are classified simultaneously on the basis of both the operation speed and the hold characteristics, the products must be classified into six grades. Therefore, it is necessary to prepare inks of at least six different colors in the marking machine, and the die bonding process requires a capability of recognizing six or more different colors. This is difficult from the viewpoint of a balance between the technique and the cost.

In addition, the sorting time for 16MDRAM of a next generation memory is expected to be 1.7 times of that required for the 4MDRAM, and the sorting time of the semiconductor device is apt to increase. This also results in an increased amount of equipment investment. Therefore, it is strongly desired to shorten the sorting time.

SUMMARY OF THE INVENTION

Accordingly, it is an object of the present invention to provide a method and an apparatus for manufacturing semiconductor devices, which overcome the above mentioned defect of the conventional one.

Another object of the present invention is to provide a method and an apparatus for manufacturing semiconductor devices, which can perform a sorting for a shortened time and with an elevated yield of production, in the process in which the electric characteristics of non-defective semiconductor chips are measured and recorded in a wafer test process, and on the basis of the obtained electric characteristics of non-defective semiconductor chips, the semiconductor chips are assembled and sorted in each different grade.

The above and other objects of the present invention are achieved in accordance with the present invention by a method for manufacturing a semiconductor integrated circuit, including a wafer test process, an assembling process and a sorting process, the method including the steps of measuring electric characteristics of a plurality of semiconductor integrated circuits formed on a wafer, causing a memory means to store the measured electric characteristics of each of the plurality of semiconductor integrated circuits together with data of the position of the semiconductor integrated circuit, cutting the plurality of semiconductor integrated circuits on the wafer into individual semiconductor integrated circuit chips, classifying on the basis of the position data and the electric characteristics of each of the semiconductor integrated circuit chips read from the memory means, the semiconductor integrated circuit chips into at least two subsets each consisting of non-defective semiconductor integrated circuit chips having the same electric characteristics different from that of products included in the other subset, and assembling and packaging the non-defective semiconductor integrated circuit chips so that the sorting is simultaneously carded out.

In a preferred embodiment of the method for manufacturing a semiconductor integrated circuit, including a wafer test process, an assembling process and a sorting process, the method includes the steps of measuring electric characteristics of a plurality of semiconductor integrated circuits formed on a wafer, causing a memory means to store the measured electric characteristics of each of the plurality of semiconductor integrated circuits together with data of the position of the semiconductor integrated circuit, cutting the plurality of semiconductor integrated circuits on the wafer into individual semiconductor integrated circuit chips, classifying on the basis of the position data and the electric characteristics of each of the semiconductor integrated circuit chips read from the memory means, the semiconductor integrated circuit chips into at least two subsets each consisting of non-defective semiconductor integrated circuit chips having the same electric characteristics different from that of products included in the other subset, and assembling and packaging the non-defective semiconductor integrated circuit chips included in each of the at least two subsets, for each of the at least two subsets, so that the sorting is simultaneously carried out.

More preferably, the measurement of electric characteristics of the plurality of semiconductor integrated circuits formed on the wafer, is performed with a range which is shifted from the precision of the measurement of the electric characteristics of the packaged semiconductor integrated circuit both in a plus direction and in a minus direction, and on the basis of the data classified into different grades based on the result of the measurement, the semiconductor integrated circuits are packaged and sorted in each of the at least two subsets.

According to another aspect of the present invention, there is provided a system for manufacturing a semiconductor integrated circuit, including a wafer test means, and an assembling and sorting means, wherein the wafer test means includes a means for measuring electric characteristics of a plurality of semiconductor integrated circuits formed on a wafer, and means for causing a memory means to store the measured electric characteristics of each of the plurality of semiconductor integrated circuits together with data of the position of the semiconductor integrated circuit, and wherein the assembling and sorting means including means for cutting the plurality of semiconductor integrated circuits on the wafer into individual semiconductor integrated circuit chips, and means for assembling and packaging the individual semiconductor integrated circuit chips for each of subsets, and further including means for performing a statistical processing for obtaining a difference between a measurement precision of the means for measuring electric characteristics of the semiconductor integrated circuits formed on the wafer, and a measurement precision of means for measuring electric characteristics of packaged semiconductor integrated circuits, the means setting, on the basis of the statistical processing, a boundary value used for the means for determining the electric characteristics of the semiconductor integrated circuits formed on the wafer, and a boundary value used for the means for measuring electric characteristics of packaged semiconductor integrated circuits, whereby a sorting time is effectively shortened.

With the above mentioned arrangement, the grade data obtained in the wafer test process is supplied to the process for physically sorting the semiconductor chips, so that the semiconductor chips are packaged in units of the same grade. As a result, the marking step is omitted, and at the same time, it is possible to theoretically remove the upper limit of the number of grades.

Now, a method for shortening the sorting time will be explained with reference to FIGS. 3A to 3F, which are flowcharts illustrating a discriminating method for sorting. FIG. 3A illustrates a process for a grade discrimination when products include only an A-grade, and FIG. 3B illustrates the process for the grade discrimination when products include only a B-grade. FIG. 3C illustrates the process for the grade discrimination when products include only a C-grade. In addition, FIG. 3D illustrates the process for the grade discrimination when products include an A-grade and a B-grade, and FIG. 3E illustrates the process for the grade discrimination when products include a B-grade and a C-grade. Furthermore, FIG. 3F illustrates the process for the grade discrimination when products include an A-grade, a B-grade and a C-grade.

The number of grade discriminations in the sorting process is dependent upon the number of grades included in a lot concerned, as seen from FIG. 3A to 3F. In other words, the larger the number of grades included in a lot concerned is, the longer the time required for the grade discriminations becomes. Therefore, it is possible to reduce the sorting time by reducing the number of grades included in a lot concerned.

FIG. 4A shows distribution of products to a given electric characteristics, and FIG. 4B shows distribution of measurement correlation between the wafer test step and the sorting step.

The measurement precision in the wafer test step is lower than that in a semiconductor device sorting step. Therefore, assuming that the measured value in the sorting step is a true value, although the true value exceeds "m" indicated by a dotted line in FIGS. 4A and 4B, some chips have the wafer test measured value of less than "m" and other chips have the true value of less than "m" and the wafer test measured value of not less than "m". Therefore, an erroneous discrimination occurs.

Distribution of probability of this "erroneous discrimination" is the distribution of measurement correlation. As shown in FIG. 4B, this distribution of measurement correlation becomes a normal distribution having a population mean value of "m". Because of the "erroneous discrimination", although the semiconductor chips are classified into different grades in the wafer test process, it is necessary to classify the products into grades, again, in the sorting process.

Here, assuming that the distribution of probability of existing of semiconductor devices in relation to the given electric characteristics is as shown in FIG. 4A, a proportion of semiconductor devices "erroneously discriminated" in connection with the electric characteristics "X" becomes a product between a value "Y" at "X" in the graph of FIG. 4A and a value "Ya" at "X" in the graph of FIG. 4B (namely, Y×Ya).

Since the graph of FIG. 4A is a normal distribution, when a standard deviation of the graph of FIG. 4A is "$\sigma$", if $|m-X| \geq 4\sigma$, it can be deemed that Y=0 and therefore Y×Ya=0.

In other words, the above mentioned "erroneous discrimination" occurs in the range of $(m-4\sigma) < X < m+\sigma$.

Now, it is assumed the grades of the semiconductor devices are such that A-grade<$X_1$, $X_1 \leq$ B-grade<$X_2$, $X_2 \leq$ C-grade, and the standard deviation of the distribution of measurement-correlation between the wafer test process and the sorting process can be expressed as $\sigma_1$. It is also assumed that, when $(|X_2-4\sigma_1|-|X_1+4\sigma_1|)>0$, the classifying boundary values in the wafer test process are set to $X_1$ and $X_2$. Namely, A-grade<$X_1$, $X_1 \leq$ B-grade<$X_2$, $X_2 \leq$ C-grade. In this case, the range in which the "erroneous discrimination" occurs is in the range of $X_1 \pm 4\sigma_1$ and in the range of $X_2 \pm 4\sigma_1$.

Accordingly, if the semiconductor chips discriminated as the A-grade in the wafer test process are packaged, the obtained semiconductor devices belong to either the A-grade or the B-grade. If the semiconductor chips discriminated as the B-grade in the wafer test process are packaged, the obtained semiconductor devices belong to the A-grade or the B-grade or the C-grade. If the semiconductor chips discriminated as the C-grade in the wafer test process are packaged, the obtained semiconductor devices belong to either the B-grade or the C-grade.

Here, it is so set that the classifying boundary values in the wafer test process are set to $X_1+4\sigma_1$ and $X_2-4\sigma_1$. Namely, it is set that A-grade<$X_1+4\sigma_1$, $(X_1+4\sigma_1) \leq$ B-grade<$(X_2-4\sigma_1)$, $(X_2-4\sigma_1) \leq$ C-grade. In this case, the above mentioned range of the "erroneous discrimination" becomes in the range from $X_1$ to $(X_1+8\sigma_1)$ and in the range from $(X_2-8\sigma_1)$ to $X_2$. Namely, all the range of the "erroneous discrimination" is included in the B-grade.

Thus, if the semiconductor chips discriminated as the A-grade in the wafer test process are packaged, the obtained semiconductor devices belong to either the A-grade or the B-grade. If the semiconductor chips discriminated as the B-grade in the wafer test process are packaged, the obtained semiconductor devices belong only to the B-grade. If the semiconductor chips discriminated as the C-grade in the wafer test process are packaged, the obtained semiconductor devices belong to either the B-grade or the C-grade.

Therefore, when the semiconductor chips discriminated as the B-grade in the wafer test process are packaged, since the obtained semiconductor devices belong only to the B-grade, the sorting time can be shortened in comparison with the case in which the classifying boundary values in the wafer test process are set to $X_1$ and $X_2$.

As mentioned above, the lot of semiconductor chips which were classified by the grades and collected in units of the same grade in the wafer test process, is again classified to one or more grades of semiconductor device products in the sorting process. However, if classifying boundary values are shifted by $4\sigma$ of the measurement correlation, the number of grades in the lot classified by the grades in the wafer test process is reduced, so that the sorting time can be reduced.

Generally, the distribution of the electric characteristics of the semiconductor devices included in one lot does not change appreciably from one lot to another. Therefore, from the result of the sorting of several lots, it is possible to obtain the approximate distribution of the electric characteristics of the semiconductor devices included in one lot. Similarly, it is possible to obtain the approximate measurement correlation by comparing the measured values obtained in the wafer test process with the measured values obtained in the sorting process for several lots. From the distribution of the characteristics and the measurement correlation of the semiconductor devices, it is also possible to obtain the distribution of the characteristics of the semiconductor chips included in each lot after the classification in the wafer test process.

As seen from the above, the sorting time can be reduced by adopting optimum classifying boundary values which should be used in the wafer test process for the purpose of realizing a maximum efficiency, by shifting the classifying boundary values in the wafer test process by $4\sigma$ toward the plus side and the minus side so that the number of grades after the classification in the wafer test process is minimized, and by calculating the necessary sorting time.

The above and other objects, features and advantages of the present invention will be apparent from the following description of preferred embodiments of the invention with reference to the accompanying drawings.

BRIEF DESCRIPTION OF THE DRAWINGS

FIGS. 6A and 6B illustrate various machines, in the form of blocks, for performing the various steps onto the semiconductor wafer in the process shown in FIGS. 5A to 5F;

DESCRIPTION OF THE PREFERRED EMBODIMENTS

First, an embodiment of the semiconductor device manufacturing process in accordance with the present invention will be described with reference to FIGS. 5A to 5E, 6A and 6B and 7A and 7B.

Figure 5A:
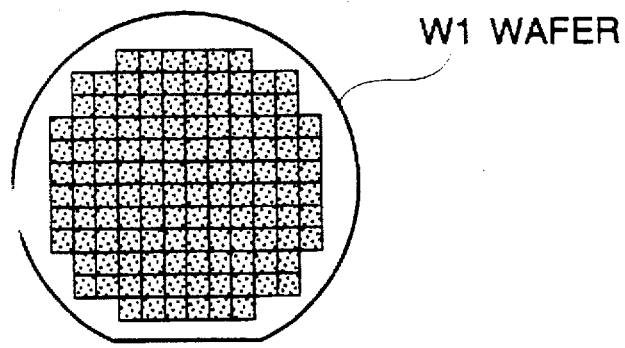
FIGS. 5A to 5F illustrate wafer conditions in various steps in a first embodiment of the semiconductor device manufacturing process in accordance with the present invention.
Figure 5B:
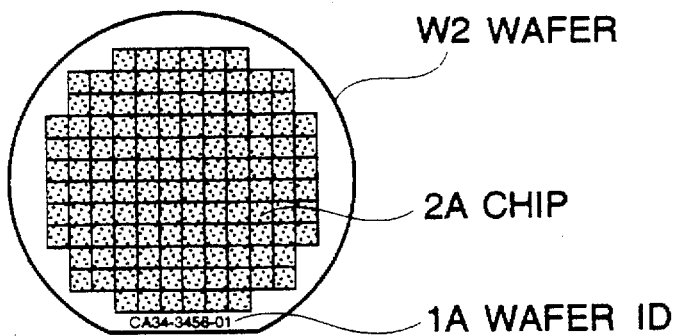

A wafer W1 shown in FIG. 5A is set on a laser marking machine 1B, and an identification indication which is composed of numbers, characters and signs and which is inherent to each wafer, is etched on the wafer by a laser. This identification indication will be called as a "wafer ID". FIG. 5B illustrates one example of the wafer W2 on which the wafer ID 1A is etched.

Figure 6A:
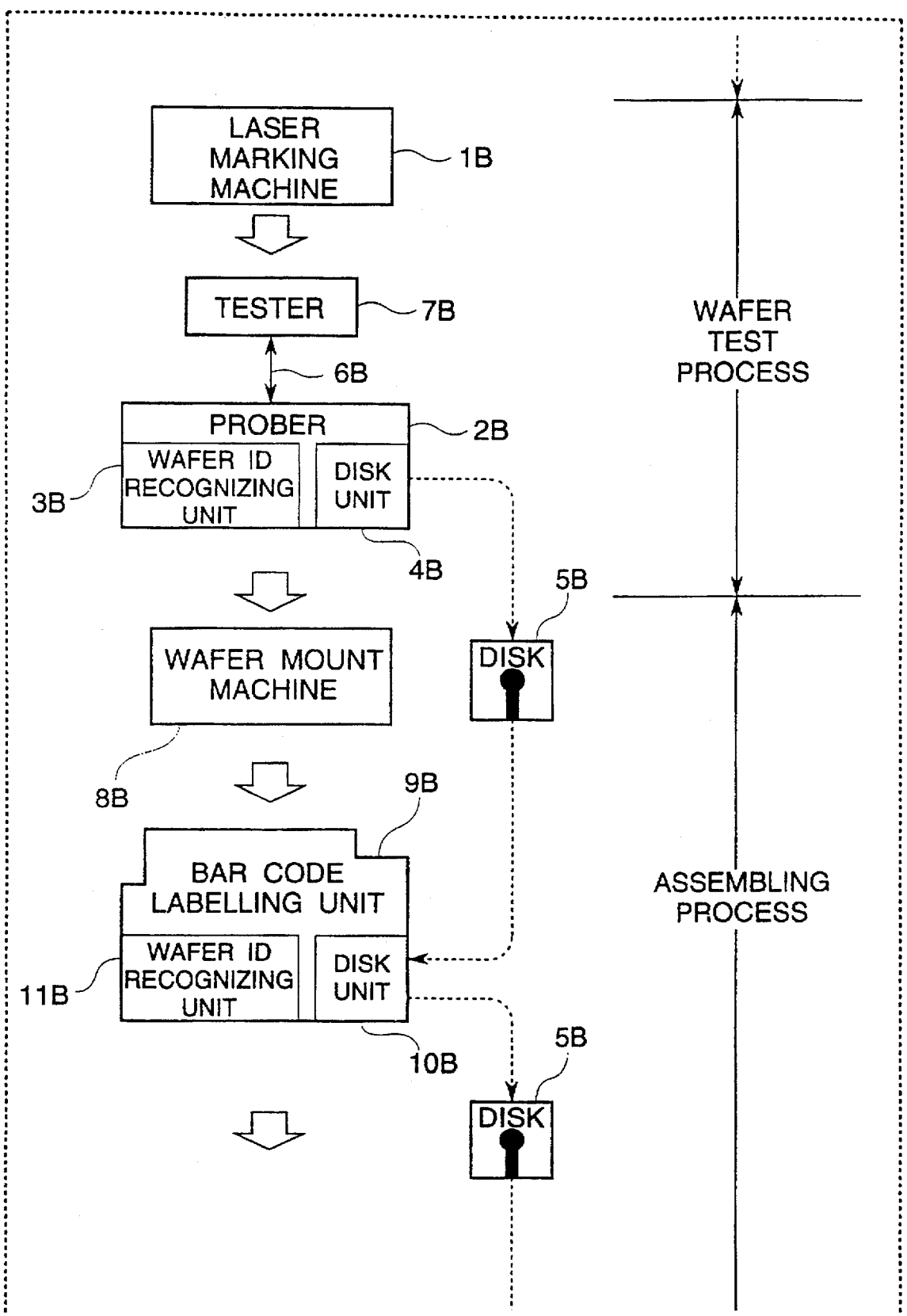

Then, the wafer is moved to a prober 2B shown in FIG. 6A. The wafer ID 1A formed on the wafer W2 is recognized by a wafer ID recognizing unit 3B provided in the prober 2B and having an image processing function and a character recognition function. The recognized wafer ID is recorded in a disk 5B in a disk unit 4B.

Thereafter, each of semiconductor chips 2A formed on the wafer W2 is measured by a tester 7B connected to the prober 2B through a GP-IB cable 6B. The measurement result, namely, the obtained data of the electric characteristics, is stored in the disk 5B in the disk unit 4B.

Here, one lot is constituted of a plurality of wafers W2, and one disk 5B is prepared for each one lot. Therefore, the disk 5B stores all the electric characteristic data of all the wafers included in one lot, by using the wafer ID as a key code.

Figure 5C:
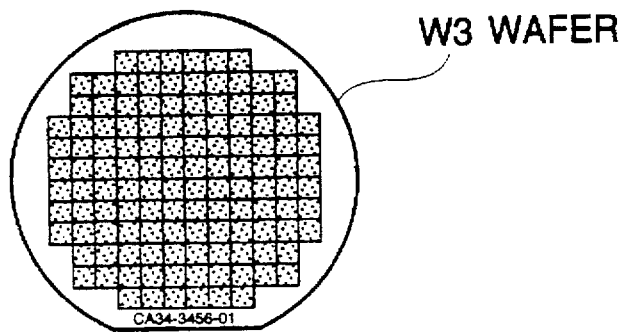

Thus, a wafer test process in the semiconductor device manufacturing process has been completed, and the tested wafers W3 as shown in FIG. 5C are packed together with the disk 5B storing the measurement result, and then, fed to an assembling process in the semiconductor device manufacturing process.

In the above mentioned description, the processing made on only one wafer has been described for convenience of description. In fact, the above mentioned processing is performed for all of a plurality of wafers included in one lot, and repeated in units of one lot.

Figure 5D:
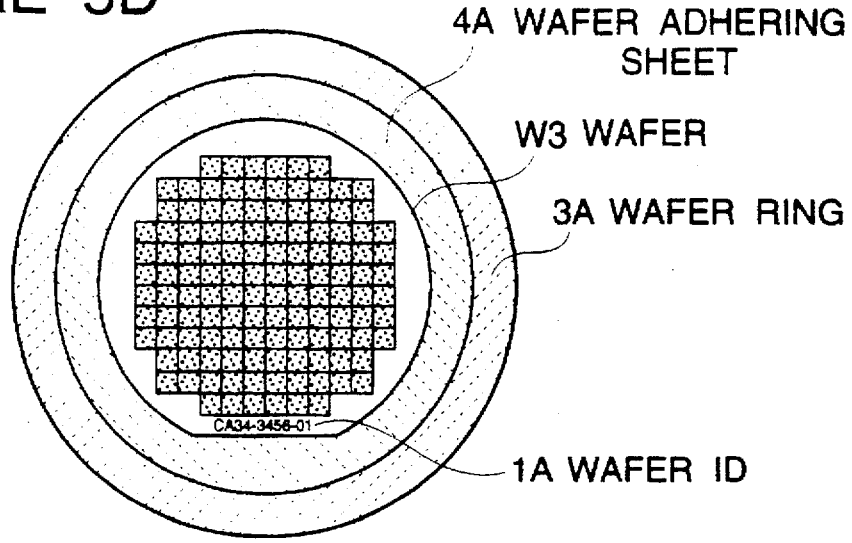

In the assembling process, the tested wafer W3 shown in FIG. 5C is adhered on a wafer adhering sheet 4A on a wafer ring 3A as shown in FIG. 5D, in a wafer mount machine 8B shown in FIG. 6A.

Then, the wafer ring 3A supporting the wafer W3 as shown in FIG. 5D is set into a bar code labelling machine 9B shown in FIG. 6A, and furthermore, the disk 5B is loaded into the disk unit 10B of the bar code labelling machine 9B.

In the bar code labelling machine 9B, the wafer ID 1A on the wafer W3 is recognized by a wafer ID recognizing unit 11B. After it is confirmed that the recognized wafer ID 1A is included in the wafer ID data recorded in the disk 5B loaded in the disk unit 10B, the recognized wafer ID 1A is converted into a bar code. A bar code label 5A bearing the obtained bar code is adhered onto the wafer adhering sheet 4A as shown in FIG. 5E.

Figure 5E:
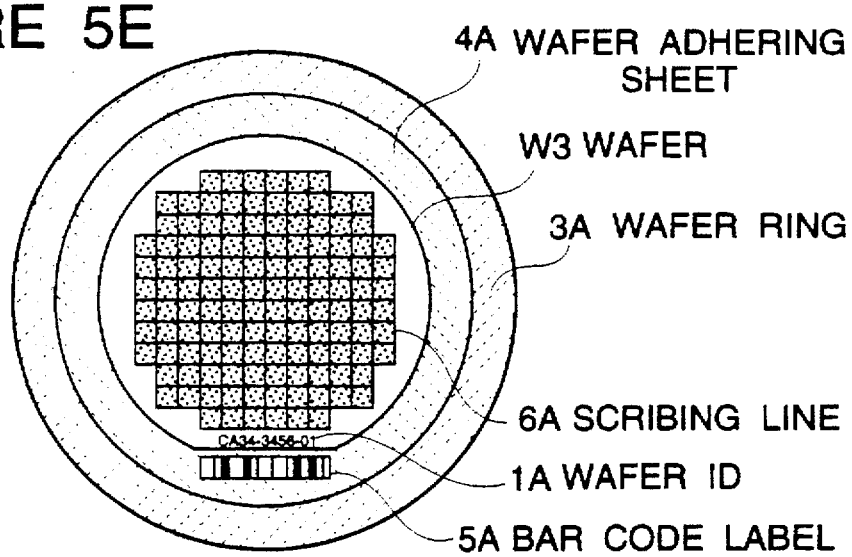

Thereafter, in a dicing machine 12B shown in FIG. 6B, the wafer W3 as shown in FIG. 5E is cut into individual semiconductor chips along scribing lines 6A on the wafer W3 extending between adjacent individual semiconductor chips.

Figure 1A:
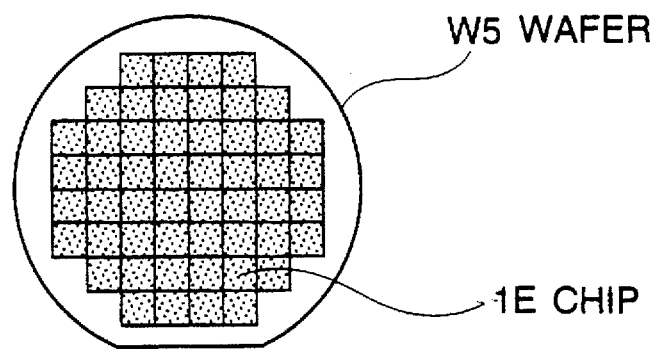
FIGS. 1A to 1E illustrate wafer conditions in various steps in the conventional semiconductor device manufacturing process.
Figure 1B:
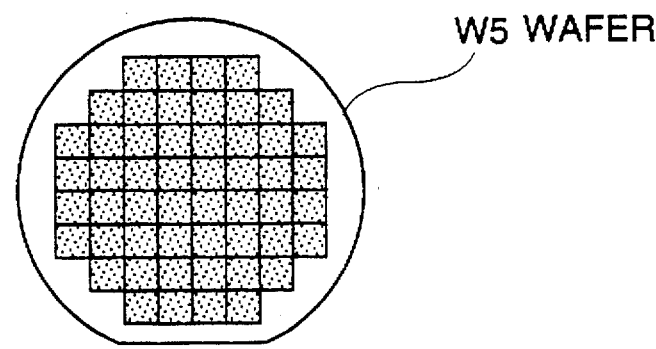
Figure 1C:
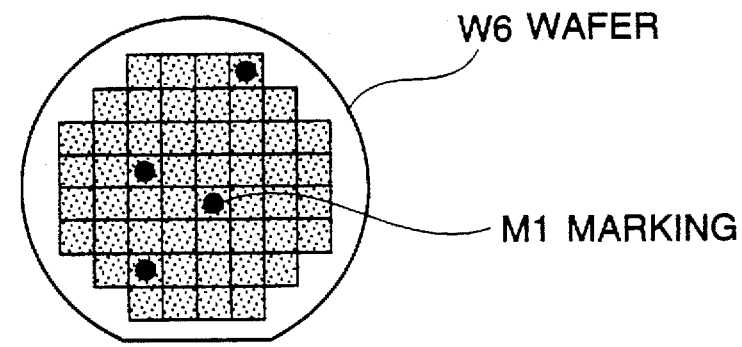
Figure 1D:
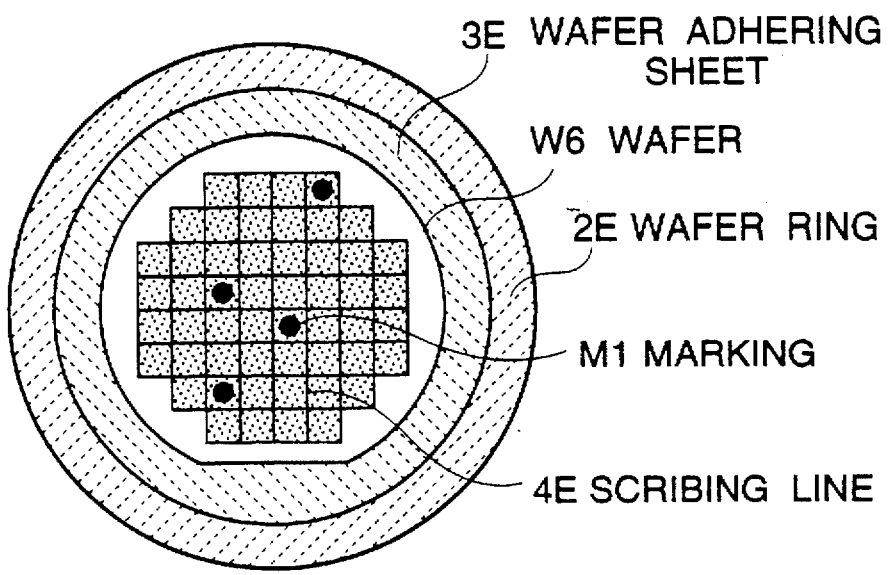
Figure 1E:
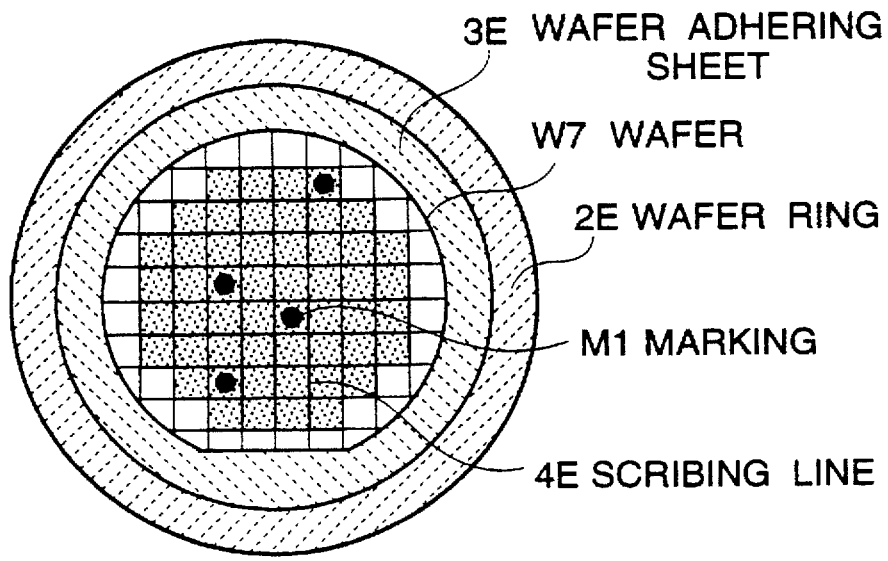
Figure 2:
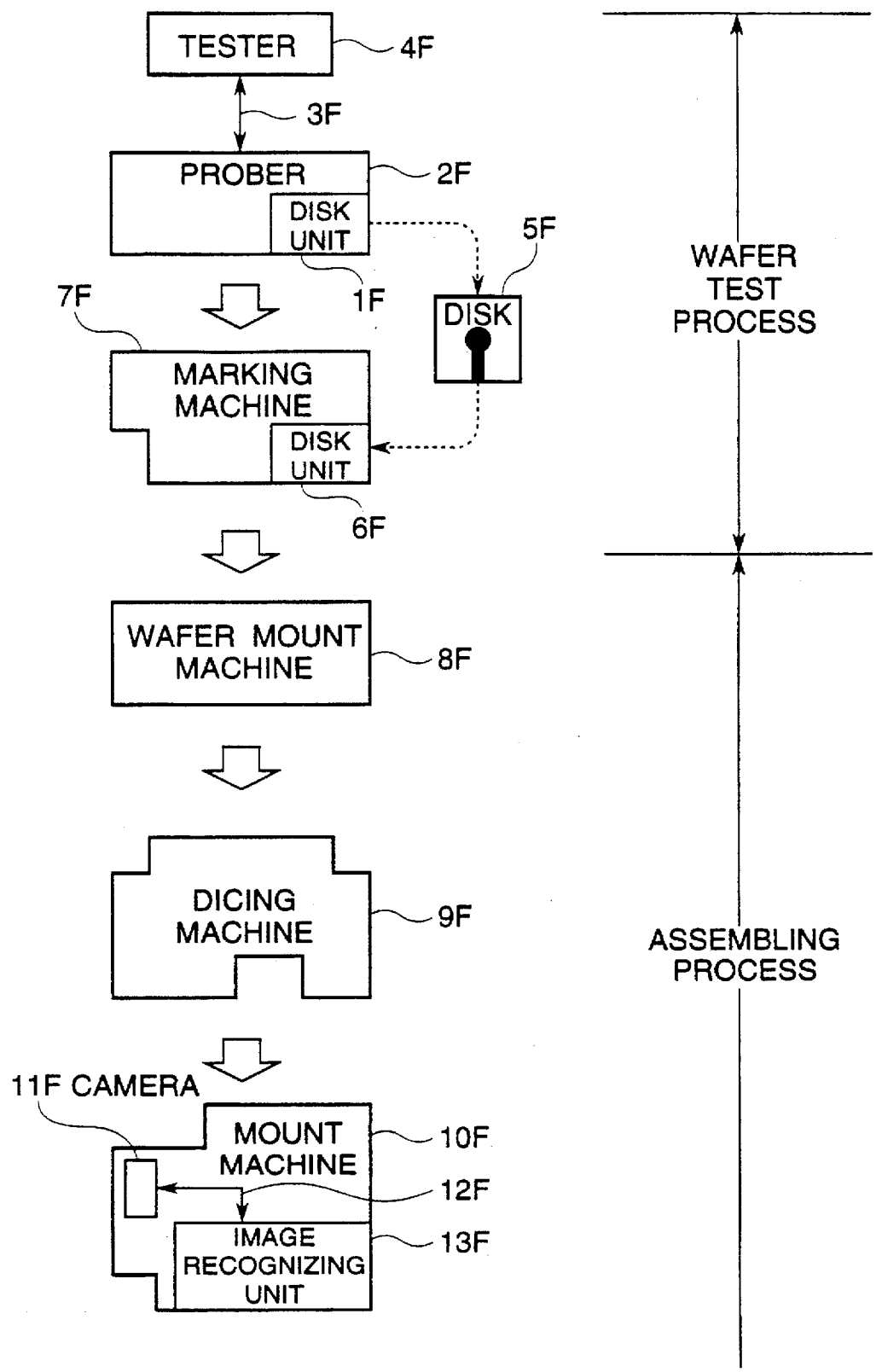
FIG. 2 illustrates various machines, in the form of blocks, for performing the various steps onto the semiconductor wafer in the conventional process shown in FIGS. 1A to 1E.
Figure 3A:
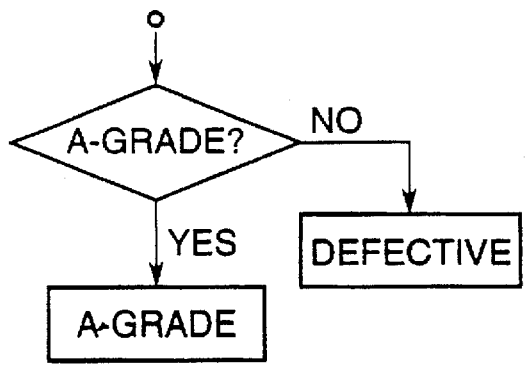
FIGS. 3A to 3F are flowcharts illustrating various discriminating methods for sorting.
Figure 3B:
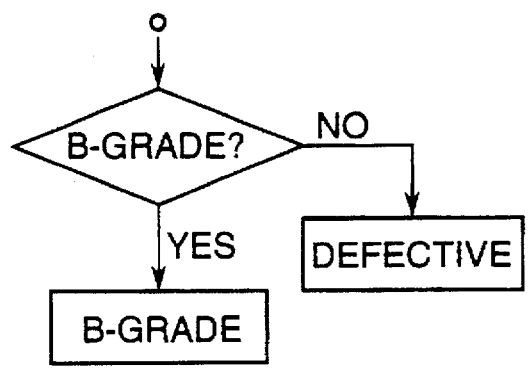
Figure 3C:
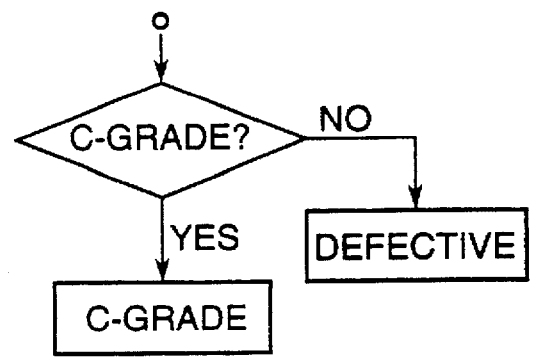
Figure 3D:
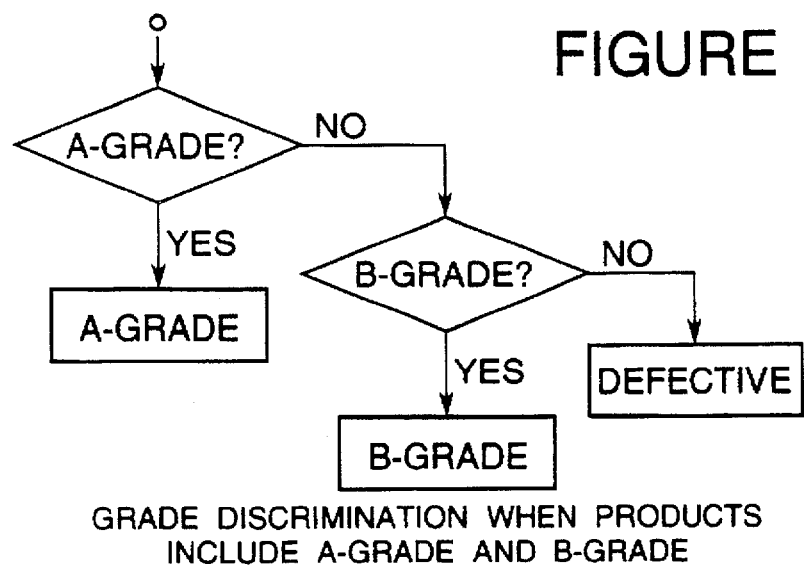
Figure 3E:
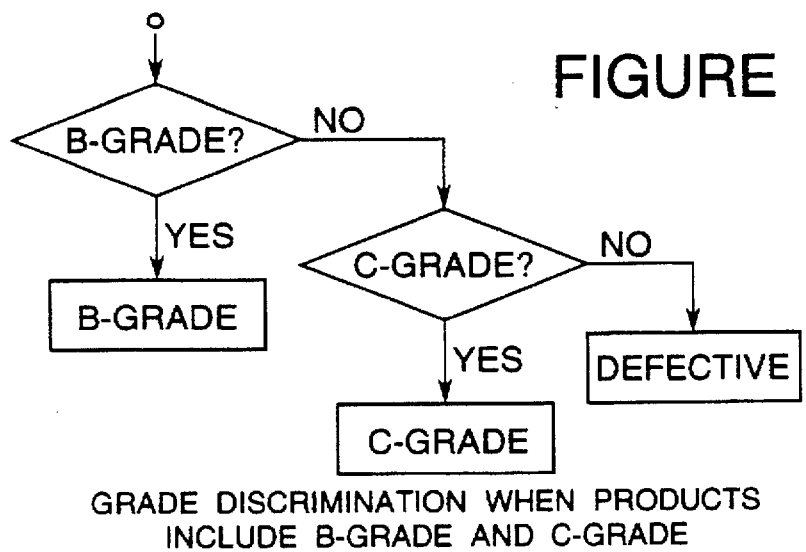
Figure 3F:
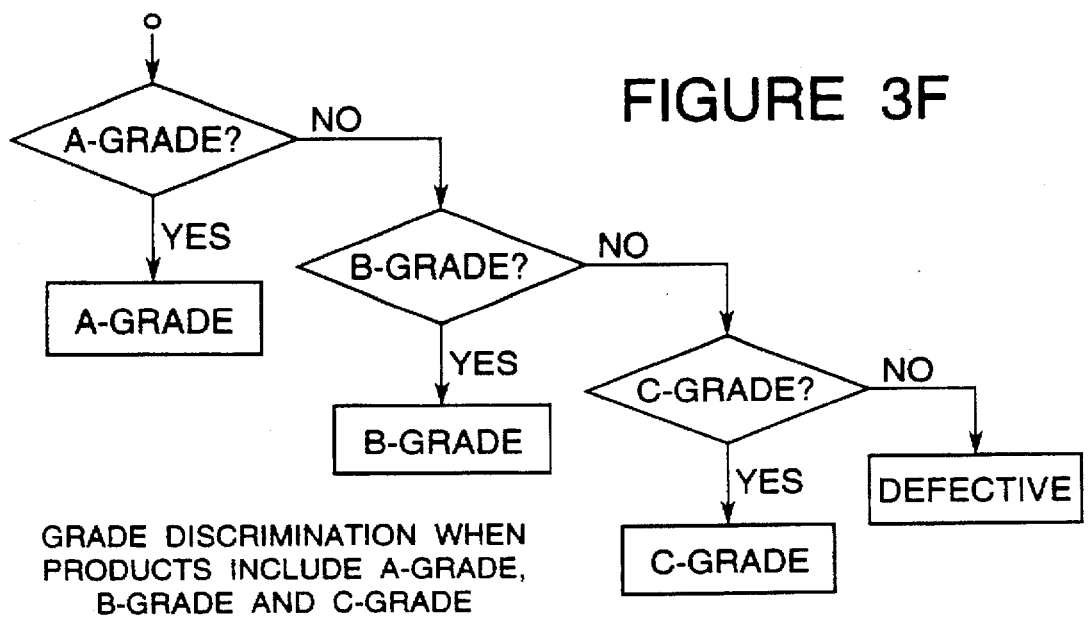
Figure 4A:
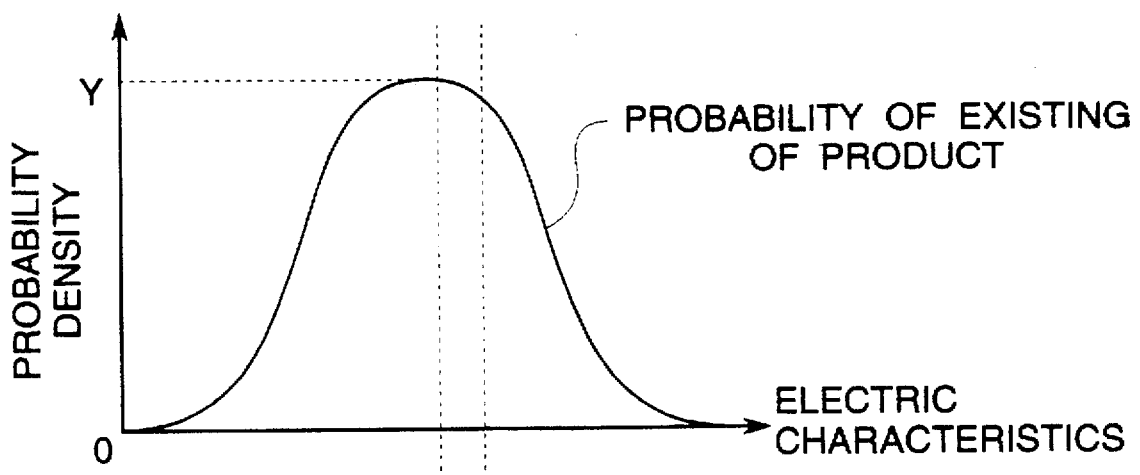
FIG. 4A shows distribution of products to given electric characteristics.
Figure 4B:
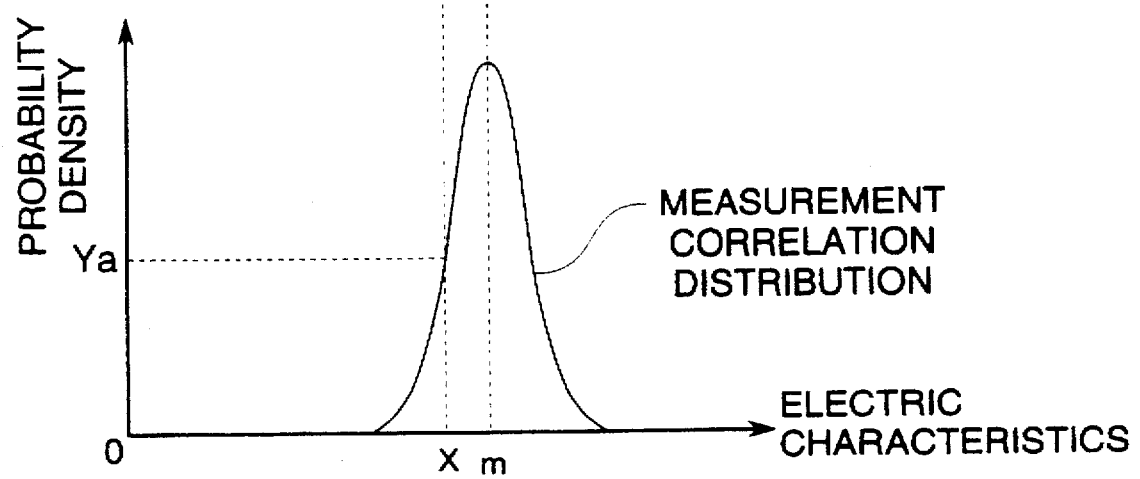
FIG. 4B shows distribution of measurement correlation between the wafer test step and the sorting step.
Figure 5F:
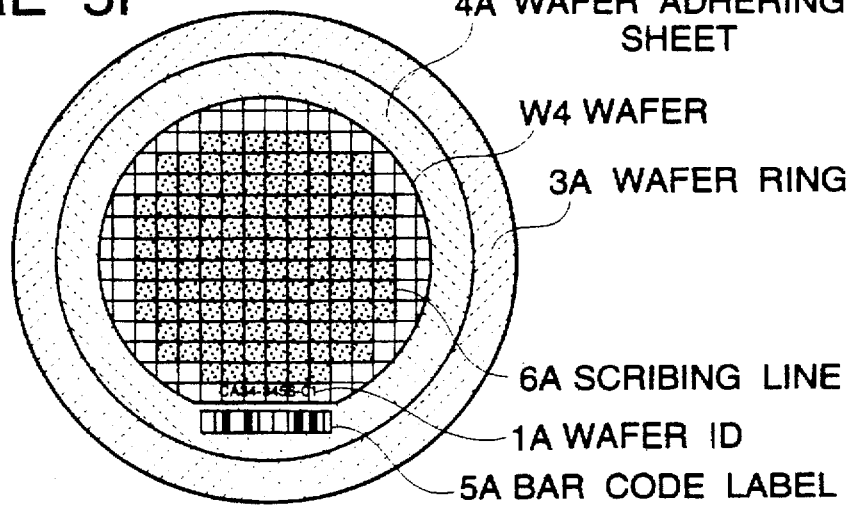

Next, the wafer ring 3A supporting the wafer W4 which is adhered to the wafer adhering sheet 4A but which was cut into the individual semiconductor chips, as shown in FIG. 5F, is set in a sorting mount machine 1C shown in FIG. 1C, and simultaneously, the disk 5B shown in FIG. 6A is moved to a disk unit 2C of the sorting mount machine 1C.

In the sorting mount machine 1C shown in FIG. 6B, a bar code reader 3C reads out the wafer ID from the bar code label 5A on the wafer adhering sheet 4A shown in FIG. 5F, and confirms that the read-out wafer ID is included in the wafer ID data recorded in the disk 5B.

Incidentally, in the shown embodiment, the disk is used as an information recording and transfer medium for storing the electric characteristics data in the measurement result in the wafer test process. However, information recording and transfer medium is not limited to the disk, and any recording medium can be used. In addition, the measurement result can be transferred through a communication channel and recorded at a receiving station.

Thereafter, although not shown, on the basis of the electric characteristics data recorded in the disk, the semiconductor chips of a grade consistent with a user's request are die-bonded to a lead frame in units of the same grade. At this time, the data of the die-bonded semiconductor chip is erased from the disk. In addition, the semiconductor chips having no demand at this stage are not picked up from the wafer adhering sheet 4A of the wafer ring 3A as shown in FIG. 5F, and will be stocked together with the disk 5B in the condition in which the semiconductor chips are adhered to the wafer adhering sheet 4A of the wafer ring 3A.

Then, the semiconductor chips die-bonded to the lead frame are packaged into a semiconductor device D1, in units or groups of the same grade, in an assembling process following the sorting mount machine 1C. The semiconductor devices D1 are classified into different grades and fed, in each group of a different grade, to a sorting process.

In the sorting process, each of semiconductor devices D1 is measured in a handler 6C connected to a tester 4C through a GP-IB cable 5C as shown in FIG. 6B, and a final non-defective/defective discrimination and a grade classification of products are performed.

Here, the tester 4C in the sorting process and the tester 7B in the wafer test process are previously adjusted in measurement correlation, by utilizing a plurality of semiconductor devices whose electric characteristics have been already discriminated. In addition, the lower and upper classifying boundary values used in the tester 7B are previously shifted by $4\sigma$ toward the minus side and the plus side, respectively.

Namely, the distribution of the electric characteristics of the semiconductor devices can be obtained from the result of the sorting in several lots. In addition, the measurement correlation can be obtained by comparing the measured values in the wafer test with the measured values in the sorting, for several lots. From the distribution of the electric characteristics of the semiconductor devices and the measurement correlation, it is possible to obtain the distribution of the semiconductor devices in each one lot after the classification in the wafer test. Furthermore, it is possible to calculate the respective sorting times. And, it is possible to calculate the necessary sorting time in each of all possible cases in which the lower and upper classifying boundary values used in the wafer test are shifted by $4\sigma$ toward the minus side and the plus side, respectively, so that the number of grades after the classification in the wafer test are changed. By selecting the classifying boundary values giving a maximum efficiency, it is possible to shorten the sorting time.

As seen from FIGS. 3A to 3F, it is possible to reduce the number of grade discriminations in the sorting process, by reducing the number of the grades included in a lot classified by the classification in the wafer test. This results in shortening sorting time.

Figure 7A:
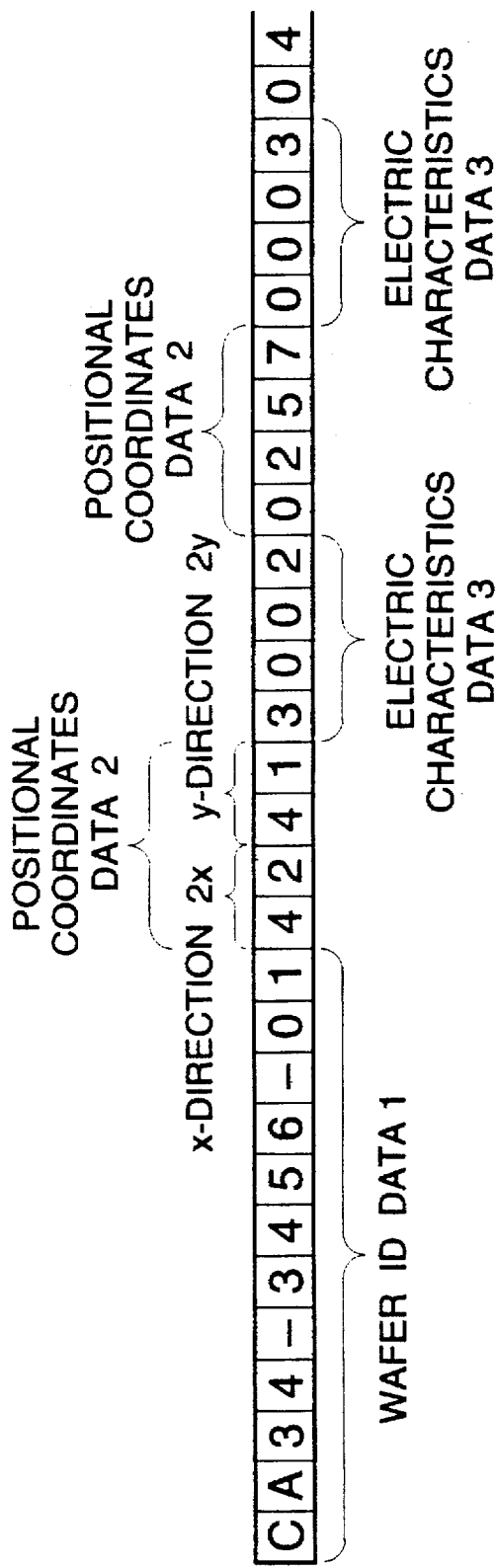
FIGS. 7A and 7B illustrate an example of a data format written into the disk and a wafer ID etched on the wafer.

FIG. 7A illustrates an example of a data format written into the disk 5B by the disk unit 4B shown in FIG. 6A. The data contains the wafer ID data (DATA 1), positional coordinates data (DATA 2) including an x-direction coordinate 2x and a y-direction coordinate 2y, and electric characteristics data (DATA 3).

The positional coordinates data (DATA 2) and the electric characteristics data (DATA 3) are written by the number of non-defective semiconductor chips existing on the wafer W2 shown in FIG. 5B.

Next, a way of utilizing and modifying the data shown in FIG. 7A in each of the wafer test process, the assembling process and the sorting process as mentioned hereinbefore.

The wafer ID 1A on the wafer W2 received into the wafer test process is recognized by the wafer ID recognizing unit 3D of the prober 2B shown in FIG. 6A, and the recognized wafer ID 1A is written as the wafer ID data (DATA 1), into the disk 5B in the disk unit 4B.

After the measurement of the wafer W2 is started in the tester 7B shown in FIG. 6A, if the measured semiconductor chip is non-defective, the positional coordinate of the non-defective semiconductor chip obtained from the prober 2B is written as the positional coordinates data (DATA 2) into the disk 5B, and the electric characteristics of the non-defective semiconductor chip obtained from the tester 7B are written as the electric characteristics data (DATA 3) into the disk 5B.

Until the measurement of one wafer is completed, at each time the measured semiconductor chip is non-defective, the positional coordinates data (DATA 2) and the electric characteristics data (DATA 3) are written into the disk 5B.

If the measurement of one wafer is completed, a new wafer is substituted, and when the measurement is started, the wafer ID 1A is written as the wafer ID data (DATA 1) into the disk 5B. A similar operation is repeated until the measurement of all the wafers of one lot is completed.

If the measurement of the wafers of one lot is completed, the wafers of the lot in which the measurement is completed are fed to a next process together with the disk storing all the data of the wafers of the lot concerned.

Figure 7B:
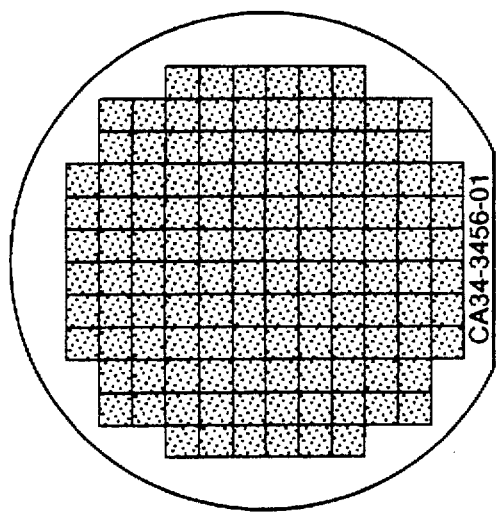

In the bar code labelling machine 9B, the wafer ID 1A as shown in FIG. 7B on the wafer is recognized by a wafer ID recognizing unit 11B. After it is confirmed that the recognized wafer ID 1A is included in the wafer ID data recorded in the disk 5B loaded in the disk unit 10B, the recognized wafer ID 1A is converted into a bar code. A bar code label 5B bearing the obtained bar code is adhered onto the wafer adhering sheet 4A as shown in FIG. 5E. After the bar code label 5B is adhered, the wafer is replaced by a next wafer, and a similar operation is repeated until all the wafers of one lot have been labelled. If the wafers of one lot are labelled, the wafers of one lot concerned and the disk written with the data for the wafers of one lot concerned are supplied to a next process.

In the sorting mount machine 1C shown in FIG. 6B, the wafer ID from the bar code label 5A on the wafer adhering sheet 4A shown in FIG. 5F, is read out by the bar code reader 3C, and the wafer ID data (DATA 1) consistent with the read-out wafer ID is investigated from the wafer ID data recorded in the disk 5B. On the basis of the positional coordinates data (DATA 2) and the electric characteristics data (DATA 3) following the determined wafer ID data (DATA 1), only the semiconductor chips of the same grade corresponding to a desired grade are bonded to a not-shown lead frame.

If the working for one wafer is completed, a next wafer is set, and a similar working is carried out. If the working for all the wafers in one lot is completed, the lot of the wafers holding the semiconductor chips which have no demand at this stage, are stocked together with the disk written with the corresponding data.

Incidentally, the electric characteristics data (DATA 3) shown in FIG. 7A mainly include the operation speed data, the hold characteristics data and the kind data.

The semiconductor chips are classified into a plurality of grades in accordance with any one of electric characteristics or a combination of a plurality of electric characteristics. For example, semiconductor chips having the operation speed of the A-grade and the hold characteristics of the D-grade are selected in the sorting mount machine 1C and mounted in the units of the same grade.

In the shown embodiment, since the semiconductor chips adhered to the wafer adhering sheet 4A are stocked together with the disk 5B storing the positional coordinates data (DATA 2) and the electric characteristics data (DATA 3) of the corresponding chips, when it becomes necessary to set a special grade which did not exist in the past (for example, the operation speed of 70 nsec to 90 nsec), it is possible to package only semiconductor chips which fulfill the special grade, by referring to the electric characteristics data (DATA 3) recorded in the disk 5B.

Figure 8:
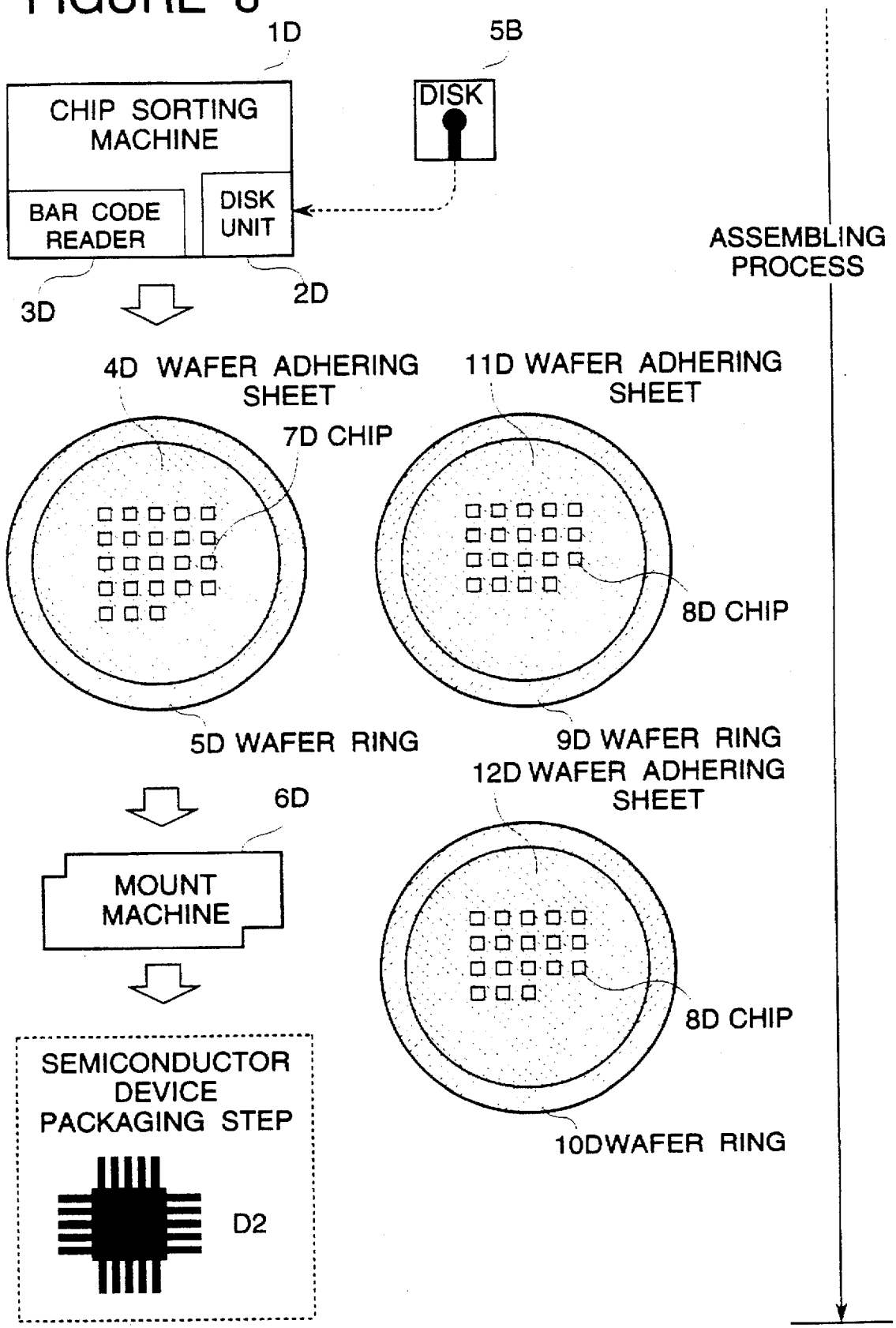
FIG. 8 illustrates various machines, in the form of blocks, for performing the various steps onto the semiconductor wafer in a second embodiment of the semiconductor device manufacturing process in accordance with the present invention.

Referring to FIG. 8, there are illustrated the sorting step and its succeeding steps of a second embodiment of the semiconductor device manufacturing process in accordance with the present invention. The second embodiment is the same as the first embodiment in the wafer test process and in the steps until the dicing machine 12 in the assembling process.

After the dicing is completed, the wafer W4 shown in FIG. 5F is set to a chip sorting machine 1D as shown in FIG. 8. In addition, the disk 5B is loaded into a disk unit 2D associated with the chip sorting machine 1D.

In the chip sorting machine 1D, the wafer ID is read out from the bar code label 5A on the wafer adhering sheet 4A, by a bar code reader 3D, and then, it is confirmed that the read-out wafer ID is consistent with one wafer ID data (DATA 1) recorded in the disk 5B. Thereafter, on the basis of the electric characteristics data (DATA 3) recorded in the disk 5B, the semiconductor chips on the wafer W6 are transferred to a wafer adhering sheet of a different wafer ring, in accordance with the grades, so that the semiconductor chips of the same grade are adhered to the wafer adhering sheet of the same (i.e., a single wafer ring).

Then, the wafer ring 5D having the wafer adhering sheet 5D to which only the semiconductor chips of a desired grade are adhered, is set in a mount machine 6D.

In this mount machine 6D, each of the semiconductor chips 7D is picked up from the wafer adhering sheet 5D, and bonded to a not-shown lead frame. On the other hand, the semiconductor chips having no demand at this stage are classified in units of grades and adhered to wafer adhering sheets 11D and 12D of different wafer rings 9D and 10D in units of grades.

The semiconductor chips bonded to the lead frame are packaged into the semiconductor device D2 in the semiconductor device assembling process after the mount machine 6D.

The succeeding semiconductor device assembling process is the same as that of the first embodiment. The method for recording the data obtained in the wafer test process into the disk 5B and the method for setting the classifying boundary values are similar to those of the first embodiment.

The second embodiment is advantageous in that since the semiconductor chips of the same grade are moved and adhered to a wafer adhering sheet of another wafer ring so that all the semiconductor chips are moved and adhered to each one wafer ring have the same grade, the bonding of the semiconductor chips to the lead frame can be performed by a conventional mount machine. In addition, since the semiconductor chips having no demand at this stage are classified in units of grades and adhered to different wafer rings in units of grades and all the semiconductor chips are-moved and adhered to a wafer ring holding chip of the same grade, the disk is no longer necessary for managing the stocked semiconductor chips.

As seen from the above, according to the present invention, it is possible to shorten the testing time in the sorting process, by effectively utilizing the data obtained in the wafer test process. In fact, the testing time in the sorting process can be shortened by about 10% in comparison with the conventional process.

As explained hereinbefore, the convention grade classification based on the hold characteristics was performed so that the semiconductor chips are voluntarily classified into 4k refresh products and 2k refresh products, and after the assembling is completed, the finished products are sorted. Therefore, products having low holding characteristics (at a level of the 2k refresh products) included in the semiconductor devices assembled as the 4k refresh products, were identified as defective. According to the present invention, by classifying the semiconductor chips on the basis of the hold characteristics data in the wafer test process, it is possible to assemble, as the 2k refresh products, the products having the holding characteristics of the 2k refresh products which were assembled as the 4k refresh products in the prior art. This can elevate the yield of production at the stage of the sorting by about 5%.

In addition, since it becomes unnecessary to assemble the semiconductor chips having less demand, into a finished product, the manufacturing cost and the stocking cost can be reduced.

The invention has thus been shown and described with reference to the specific embodiments. However, it should be noted that the present invention is in no way limited to the details of the illustrated structures but changes and modifications may be made within the scope of the appended claims.

I claim:

1. A method for manufacturing a semiconductor integrated circuit, including a wafer test process, an assembling process and a sorting process, the method including the steps of:

measuring electric characteristics of a plurality of semiconductor integrated circuits formed on a wafer;

identifying semiconductor integrated circuits of said plurality which are non-defective;

causing a memory means to store the measured electric characteristics of each of said plurality of semiconductor integrated circuits identified as non-defective together with data identifying a position of each of said plurality of the semiconductor integrated circuits identified as non-defective;

cutting said plurality of semiconductor integrated circuits on said wafer into individual semiconductor integrated circuit chips;

classifying said non-defective semiconductor integrated circuit chips on the basis of the respective position data and the electric characteristics of each of said non-defective semiconductor integrated circuit chips read from said memory means into at least two subsets each consisting of non-defective semiconductor integrated circuit chips having the same electric characteristics, said electric characteristics being different from that of semiconductor integrated circuit chips included in the at least one other subset; and assembling and packaging the non-defective semiconductor integrated circuit chips so that the sorting into each of the at least two subsets is carried out simultaneously therewith.

2. A method for manufacturing a semiconductor integrated circuit, including a wafer test process, an assembling process and a sorting process, the method including the steps of:

measuring electric characteristics of a plurality of semiconductor integrated circuits formed on a wafer;

identifying semiconductor integrated circuits of said plurality which are non-defective;

causing a memory means to store the measured electric characteristics of each of said plurality of semiconductor integrated circuits identified as non-defective together with data identifying a position of each of said plurality of the semiconductor integrated circuits identified as non-defective;

cutting said plurality of semiconductor integrated circuits on said wafer into individual semiconductor integrated circuit chips;

classifying said non-defective semiconductor integrated circuit chips on the basis of the respective position data and the electric characteristics of each of said non-defective semiconductor integrated circuit chips read from said memory means into at least two subsets having the same electric characteristics, said electric characteristics being different from that of semiconductor integrated circuit chips included in the at least one other subset; and assembling and packaging the non-defective semiconductor integrated circuit chips included in each of said at least two subsets, for each of said at least two subsets, so that the sorting into each of the at least two subsets is carried out simultaneously therewith.

3. A method claimed in claim 2 wherein said step of measuring electric characteristics of a plurality of semiconductor integrated circuits formed on a wafer is performed in a range determined by a precision of the measurement of the electric characteristics of the packaged semiconductor integrated circuits and said step of packaging and sorting the non-defective semiconductor integrated circuit chips in each of said at least two subsets is performed on the basis of grades based on the measured electrical characteristics.

* * * * *